(12) United States Patent
Helfenstein et al.

(10) Patent No.: US 6,584,486 B1
(45) Date of Patent: Jun. 24, 2003

(54) METHOD FOR MATHEMATICALLY PROCESSING TWO QUANTITIES IN AN ELECTRONIC CIRCUIT

(75) Inventors: Markus Helfenstein, Lucerne (CH); Hans-Andrea Loeliger, Zürich (CH); Felix Lustenberger, Cham (CH); Felix Tarköy, Basel (CH)

(73) Assignee: Anadec GmbH (CH)

( * ) Notice: Subject to any disclaimer, the term of this patent is extended or adjusted under 35 U.S.C. 154(b) by 535 days.

(21) Appl. No.: 09/628,578

(22) Filed: Jul. 31, 2000

(30) Foreign Application Priority Data

Aug. 6, 1999 (CH) .............................................. 1448/99

(51) Int. Cl.[7] .............................................. G06G 7/16
(52) U.S. Cl. ...................................... 708/835; 708/801
(58) Field of Search ................................ 708/801, 835; 327/357

(56) References Cited

U.S. PATENT DOCUMENTS

| | | | | |
|---|---|---|---|---|
| 4,374,335 A | | 2/1983 | Fukahori et al. ............. | 307/521 |
| 4,586,155 A | * | 4/1986 | Gilbert ........................ | 708/835 |
| 5,389,840 A | * | 2/1995 | Dow ............................ | 708/835 |
| 5,764,559 A | | 6/1998 | Kimura ........................ | 364/841 |
| 6,014,685 A | * | 1/2000 | Marshall et al. ............. | 708/801 |

FOREIGN PATENT DOCUMENTS

| | | | |
|---|---|---|---|
| DE | 19725275 A1 | 12/1998 | |
| EP | 1024450 A1 | 8/2000 | ............ G06G/7/24 |

OTHER PUBLICATIONS

1998 IEEE ISIT, Aug. 16–21, 1998, p. 146, Hans–Andrea Loeliger et al., "Probability Propagation and Decoding in Analog VLSI".

1999 IEEE–ISCAS '99, May 30–Jun. 2, 1999, pp II–424–1427, Felix Lustenberger et al., "An Analog VLSI Decoding Technique for Digital Codes".

IEEE Communications Magazine, Apr. 1999, vol. 37, No. 4, pp 99–101, Hans–Andrea Loeliger et al., "Decoding in Analog VLSI".

IEEE Journal of Solid–State Circuits, vol.–SC–3, No. 4, Dec. 1968, pp. 365–373, Barrie Gilbert, "A Precise Four–Quadrant Multiplier with Subnanosecond Response".

IEEE Journal of Solid–State Circuits, vol. SC–19, No. 6. Dec. 1984, pp 956–963, Barrie Gilbert, "A Monolithic 16–Channel Analog Array Normalizer".

IEEE Circuits and Systems Series 5, Chapter 3, pp 31–70, John B. Hughes et al., "Switched–Current Architectures and Algorithms", Undated.

IEEE Transactions on Communications, vol. 36, No. 1, Jan. 1988, pp 13–20, M. Vedat Eyuboğlu et al., "Reduced–State Sequence Estimation with Set Partitioning and Decision Feedback".

* cited by examiner

*Primary Examiner*—Tan V. Mai
(74) *Attorney, Agent, or Firm*—Ohlandt, Greeley, Ruggiero & Perle, LLP; George W. Rauchfuss, Jr.

(57) ABSTRACT

The method serves to add at least two values by means of a circuit. Both input values and output values are represented in differential form, either as a pair of voltages or as a pair of currents. The circuit consists of four transistors; it has a pair of current inputs for one of the input values, a pair of voltage inputs for the other input value, and a pair of current outputs for the output value. The voltage between the two voltage inputs corresponds to the first input value; the quotient of the currents through the two current inputs corresponds to the exponential of the other input value; and the quotient of the currents through the two current outputs corresponds to the exponential of the sum of the two input values. Values represented by voltages are easily transformed into current representation, and vice versa. The method is suitable for a variety of applications and the circuit can be cascaded both with copies of itself and with other circuits.

23 Claims, 7 Drawing Sheets

US 6,584,486 B1

METHOD FOR MATHEMATICALLY PROCESSING TWO QUANTITIES IN AN ELECTRONIC CIRCUIT

CROSS REFERENCE TO RELATED APPLICATIONS

This application claims the priority of Swiss patent application 1448/99, filed Aug. 6, 1999, the disclosure of which is incorporated herein by reference in its entirety.

BACKGROUND OF THE INVENTION

The invention relates a method for mathematically processing two quantities in an electronic circuit.

Analog addition circuits are usually based on the principle of current addition. Such adders are not always suitable for implementation in integrated circuits.

BRIEF SUMMARY OF THE INVENTION

Hence, it is a general object of the invention to provide a method of this type that is suited for integration.

Now, in order to implement these and still further objects of the invention, which will become more readily apparent as the description proceeds, the method for mathematically processing at least two values $r_x$ and $r_y$ in a combination circuit uses a combination circuit comprising two current inputs $E_{x,0}$ and $E_{x,1}$ for the value $r_x$, two voltage inputs $E_{y,0}$ and $E_{y,1}$ for the value $r_y$, two current outputs $A_0$ and $A_1$ for a result $r_z$, and four transistors $T_{0,0}, T_{0,1}, T_{1,0}, T_{1,1}$, wherein the sources or emitters of the transistors $T_{0,0}$ and $T_{0,1}$ are connected to the current input $E_{x,0}$, the sources or emitters of the transistors $T_{1,0}$ and $T_{1,1}$ to the current input $E_{x,1}$, the gates or bases of the transistors $T_{0,0}$ and $T_{1,0}$ to the voltage input $E_{y,0}$, the gates or bases of the transistors $T_{0,1}$ and $T_{1,1}$ to the voltage input $E_{y,1}$, the drain or collector of the transistor $T_{0,0}$ to the current output $A_0$, the drain or collector of the transistor $T_{1,1}$ with the current output $A_1$, and the drains or collectors of the transistors $T_{0,1}$ and $T_{1,0}$ to a reference potential providing a saturation or forward polarization. The method comprises the steps of feeding two input currents $I_x p_x(0)$ and $I_x p_x(1)$ through the current inputs $E_{x,0}$ and $E_{x,1}$, wherein a quotient of said input currents is equal to $e^{r_x}$, applying an input voltage between said voltage inputs $E_{y,0}$ and $E_{y,1}$ proportional to $r_y$, and generating, with said combination circuit, two output currents at the current outputs $A_0$ and $A_1$, wherein a quotient of said output currents is equal to $e^{r_x+r_y}$, and deriving, from said output currents, a sum of the values $r_x$ and $r_y$.

The method relies on a circuit consisting of transistors only. Every quantity is represented by a pair of currents or by a voltage between two voltage input terminals. If some quantity r is represented by a pair of currents, the ratio of the two currents corresponds to $e^r$; if it is represented by a voltage, the voltage corresponds to r. Transformations between these two representations can also be realized by simple circuits that consist of transistors only and can be integrated easily.

In references H. -A. Loeliger, F. Lustenberger, M. Helfenstein, F. Tarköy, "Probability Propagation and Decoding in Analog VLSI", Proc. of 1998 IEEE Intl. Symposium on Information Theory, Cambridge, Mass., 16–21 August 1998, p. 146 referred to as [1]), in F. Lustenberger, M. Helfenstein, H. -A. Loeliger, F. Tarköy, and G. S. Moschytz, "An Analog Decoding Technique for Digital Codes", Proceedings of ISCAS '99, Orlando, Fla., May 30–Jun. 2, 1999, vol. II, pp. 428–431 (referred to as [2]), as well as in H. -A. Loeliger, F. Tarköy, F. Lustenberger, M. Helfenstein, "Decoding in Analog VLSI", IEEE Communications Magazine, vol. 37, no. 4, April 1999, pp. 99–101 (referred to as [3]), a type of transistor network was presented by which a variety of signal processing algorithms—in particular the decoding of error correcting codes—can be realized. These analog networks work with quantities that represent probabilities. The invention presented here expands the application of such networks to tasks that, at first sight, have nothing to do with probabilities. In particular, one circuit of [1] is now used as an adder. With such adders, a number of signal processing algorithms such as, for example, discrete-time adaptive analog filters can be realized as circuits with advantageous properties. In particular, networks containing both such adders and Gilbert-multipliers are suitable for preprocessing data that is subsequently processed by the probability networks presented in [1].

The claimed method can be applied in a variety of ways, e.g. in correlators and filters.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Before describing a specific implementation of the invention, the theoretical foundations of the circuits to be used are summarized below.

As in [1] and [2], the circuits described in the following can be realized either with field effect transistors or with bipolar junction transistors. For the sake of simplicity, only field effect transistors are used in the circuit diagrams. For the following discussion, transistors are usually modeled as ideal voltage controlled current sources, where the drain current (or the collector current) depends exponentially on the gate-source voltage (or on the base-emitter voltage if bipolar transistors are used). Then $$I_{drain} = I_0 \cdot e(\kappa \cdot V_{gate} - V_{source})/U_T \quad (1)$$

for field effect transistors and $$I_{coll} = I_0 \cdot e(V_{base} - V_{emit})/U_T \quad (2)$$

for bipolar transistors, where $\kappa$ is a dimensionless constant and $U_T$ is the so-called thermal voltage. Eq. (1) holds for MOS transistors with a weakly inverted channel in saturation; Eq. (2) holds for bipolar transistors in forward polarization. In order to treat both transistor types simultaneously, it will be assumed that $\kappa=1$ for bipolar transistors.

Figure 1:
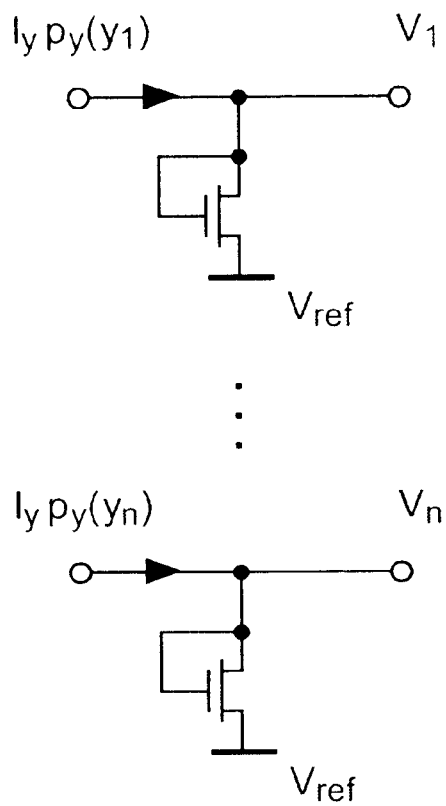
FIG. 1 a vector-logarithm circuit for conversion from current representation into voltage representation, FIG. 2 a vector-exponential circuit for conversion from voltage representation into current representation, FIG. 3 a vector-exponential circuit with integrated current scaling for converting from voltage representation into current representation, FIG. 4 a "soft exclusive-OR" circuit or Gilbert-multiplier, FIG. 5 an adder circuit with inputs and outputs in current representation, FIG. 6 the kernel of the adder circuit, FIG. 7 a configuration of switches to change the sign of the input voltage, FIG. 8 the block diagram of a possible implementation of the scaling of input data that can have a finite number of discrete values, FIG. 9 the concatenation of modules as in FIG. 6 by level shifters, FIG. 10 a linear FIR filter with n filter tap coefficients, FIG. 11 the block diagram of a decision feedback equalizer (DFE), FIG. 12 the block diagram of an accumulator, FIG. 13 a current storage element, FIG. 14 an adaptive FIR filter with n adaptive filter tap coefficients, FIG. 15 the block diagram of a data communications receiver.
Figure 2:
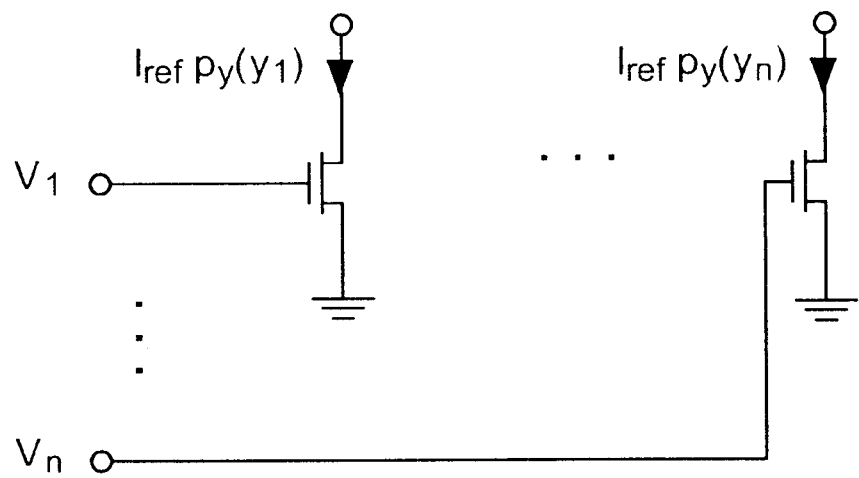

The networks of [1] operate with probability distributions (probability mass functions) of the form $p_y: Y \rightarrow [0,1]$, where $Y=\{y_1, \ldots, Y_n\}$ is a finite set (or "alphabet") and $P_y(y_1) + P_y(y_2) + \ldots + p_y(y_n) = 1$. Such probability distributions can be described by the list (or the "vector") $[p_y(y_1), p_y(y_2), \ldots, p_y(y_n)]$ of function values; in the circuits, they are represented either by a current vector $[I_1, \ldots, I_n]$ with $I_i = I_y \cdot p_y(y_i)$ and arbitrary sum current $I_y$, or by a voltage vector $[V_1, \ldots, V_n]$ with $V_i = V_r + (U_T/\kappa) \cdot \ln(p_y(y_i))$ and an arbitrary reference potential $V_r = V_{source}/\kappa$. The current representation can be transformed into the voltage representation by means of the diode-connected transistors of FIG. 1. The reverse transformation can be carried out by the circuit of FIG. 2, which is the simplest realization, or by the circuit of FIG. 3, which contains a scaling circuit for the total output current as described by B. Gilbert, "A Monolitic 16-Channel Analog Array Normalizer", IEEE Journal of Solid-State Circuits, vol. 19, pp. 956–963, 1984 (referred to as [5]). Note that the potential $V_{ref}$ in FIG. 1 is not identical to the potential $V_r$ introduced above.

Any probability distribution defined on the binary alphabet $Y=\{0,1\}$ is fully determined by the number $$r_y = ln(p_y(0)/p_y(1)). \quad (3)$$

This number appears in the voltage representation as the difference (scaled by $U_T/\kappa$) of the two voltages $$(V_r + (U_T/\kappa) \cdot ln(p_y(0))) - (V_r + (U_T/\kappa) \cdot ln(p_y(1))) = (U_T/\kappa) \cdot r_y. \quad (4)$$

Figure 4:
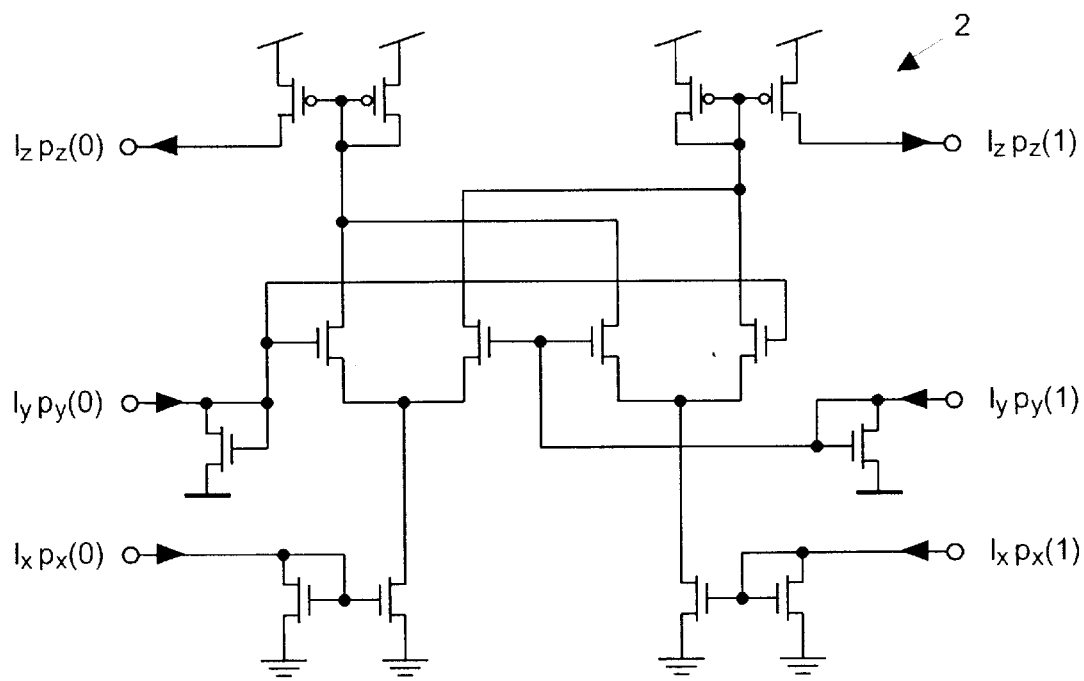
Figure 5:
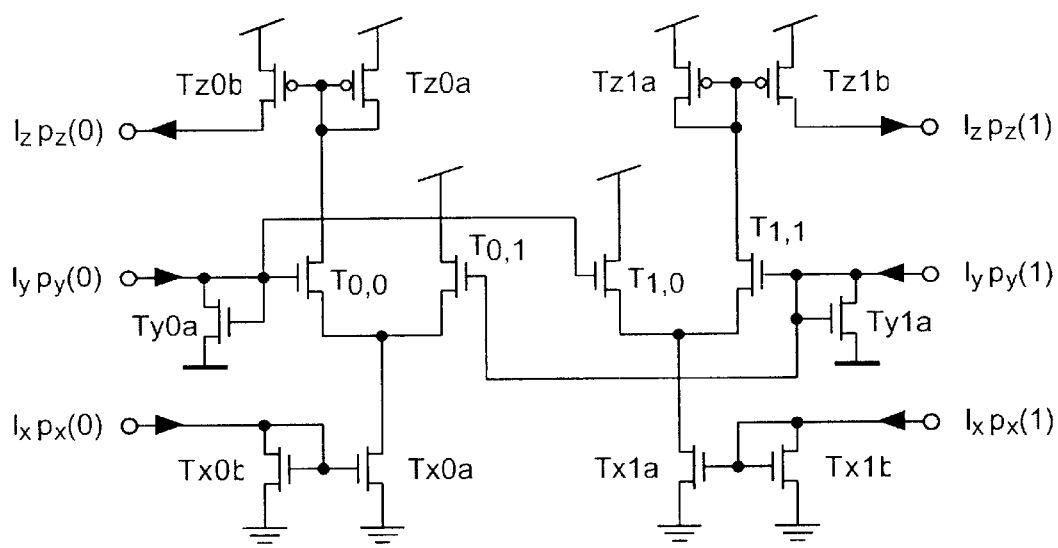

Two important circuit modules of the large family of circuit modules of [1] are shown in FIG. 4 and FIG. 5. In both cases, both input alphabets X and Y as well as the output alphabet Z are binary: $X=Y=Z=\{0,1\}$. The circuit 2 of FIG. 4 (well known as a version of the Gilbert multiplier) computes $$p_z(0) = p_x(0) \cdot p_y(0) + p_x(1) \cdot p_y(1) \quad (5)$$

$$p_z(1) = p_x(0) \cdot p_y(1) + p_x(1) \cdot p_y(0)$$

(the "soft-exclusive-OR" function); the circuit of FIG. 5 computes $$p_z(0) = \gamma \cdot p_x(0) \cdot p_y(0) \quad (6)$$

$$p_z(1) = \gamma \cdot p_x(1) \cdot p_y(1)$$

where the scale factor $\gamma$, which is mathematically required to yield $p_z(0) + p_z(1) = 1$, is implicit in the interpretation of the output currents $I_z$ and does not occur in the circuit.

Figure 3:
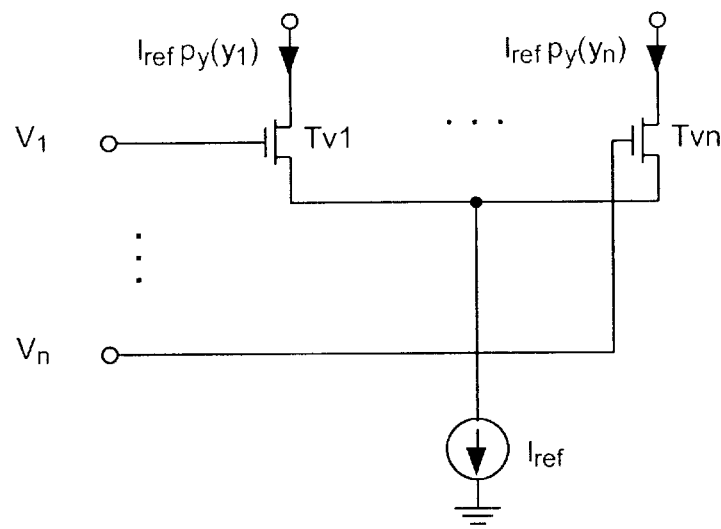

However, for practical reasons, it may be advantageous or necessary to scale a current vector to some desired total current; this is achieved by cascading the circuits of FIG. 1 and FIG. 3, see [1]–[3][5].

In FIG. 4 and FIG. 5, all input and output signals $p_x$, $p_y$ and $p_z$ are represented by current vectors. However, as the comparison with FIG. 1 shows, in both FIG. 4 and FIG. 5 the input signals $p_x$ and $p_y$ are first converted into the voltage representation. Moreover, the output signal $p_z$ is also available as gate potentials or base potentials respectively within the output current mirrors in the voltage representation. By simply omitting the corresponding transistors, both inputs can be provided, and outputs are available, in voltage representation.

Figure 6:
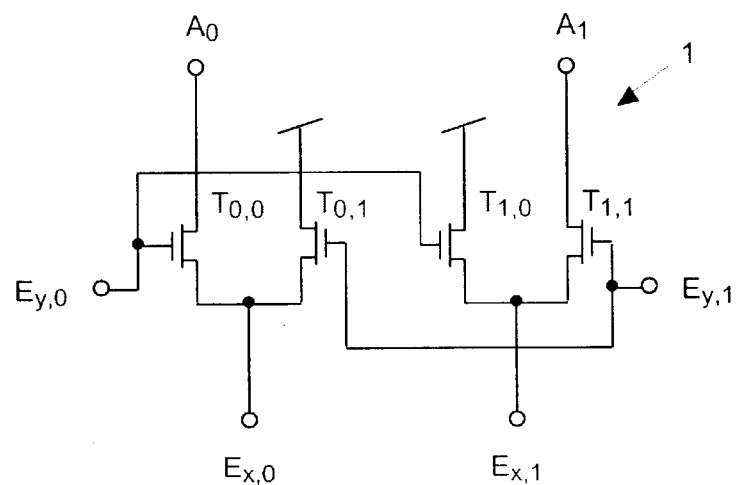

FIG. 6 shows the innermost kernel of the circuit of FIG. 5 after omitting all transistors that do not contribute to the actual computation. The circuit will be referred to as combination circuit 1. It has two current inputs $E_{x,0}$ and $E_{x,1}$ for $p_x$, two voltage inputs $E_{y,0}$ and $E_{y,1}$ for $p_y$, two current outputs $A_0$ and $A_1$ for the result $r_z$, and four transistors $T_{0,0}$, $T_{0,1}$, $T_{1,0}$, $T_{1,1}$.

The source (or emitter) of transistors $T_{0,0}$ and $T_{0,1}$ are connected with $E_{x,0}$, the source (emitter) of transistors $T_{1,0}$ and $T_{1,1}$ are connected with $E_{x,1}$, the gate (or base) of transistors $T_{0,0}$ and $T_{1,0}$ are connected with $E_{y,0}$, the gate (base) of transistors $T_{0,1}$ and $T_{1,1}$ are connected with $E_{y,1}$, the drain (collector) of transistor $T_{0,0}$ connected with $A_0$, the drain (collector) of transistor $T_{1,1}$ is connected with $A_1$, and the drain (collector) of transistors $T_{0,1}$ and $T_{1,0}$ are connected to a reference potential that ensures saturation or forward polarization, respectively, of these two transistors. The quotient of the two currents drawn out of $E_{x,0}$ and $E_{x,1}$ equals $e^{r_x}$, and the voltage applied between $E_{y,0}$ and $E_{y,1}$ is proportional to $r_y$. The quotient of the output currents through $A_0$ and $A_1$ therefore equals $e^{r_x} \cdot e^{r_y}$.

From the quotient of the output currents, the sum of $r_x$ and $r_y$ can thus be obtained by taking logarithms, e.g., by connecting the outputs $A_0$ and $A_1$ to diode connected transistors Tz0a and Tz1a as in FIG. 5. In FIG. 5, however, these transistors, together with their counterparts Tz0b and Tz1b, form current mirrors that produce output currents $I_z p_z(0)$ and $I_z p_z(1)$, the quotient of which is again $e^{r_x} \cdot e^{r_y}$, and which can be fed to further circuit modules, for example to the modules shown in FIG. 4 or FIG. 5.

The input currents for the current inputs $E_{x,0}$ and $E_{x,1}$ are preferably generated by applying the value $r_x$ as voltage difference between the gates (bases) of two transistors Tx0a and Tx1a, as shown in FIG. 5. In FIG. 5, each of the transistors Tx0a and Tx1a are again part of a current mirror, with counterparts Tx0b and Tx1b, respectively. The quotient of the input currents $I_x p_x(0)$ and $I_x p_x(1)$ is thus $e^{r_x}$.

In FIG. 5, the input voltages for the voltage inputs $E_{y,0}$ and $E_{y,1}$ are generated by passing each of the input currents $I_y p_y(0)$ and $I_y p_y(1)$, the quotient of which is $e^{r_y}$, through diode connected transistors Ty0a and Ty1a, respectively.

The input currents drawn out of the current inputs $E_{x,0}$ and $E_{x,1}$ and/or the output currents through the current outputs $A_0$ and $A_1$ and/or any two currents used to produce the input voltage between $E_{y,0}$ and $E_{y,1}$ (such as the currents $I_y p_y(0)$ and $I_y p_y(1)$, respectively) can be scaled by generating them by means of two transistors TV1 and TVn, the source (emitter) of which is connected to a current source ($I_{ref}$) i.e., by a circuit as in FIG. 3. In this way, the sum of the currents equals some prescribed value ($I_{ref}$), which makes such circuit modules freely cascadable.

In particular, the current inputs, the voltage inputs, and/or the current outputs can be connected to at least another combination circuit 1 and/or at least another Gilbert multiplier 2. Such a connection can be direct or indirect, e.g.:

by connecting the inputs (or outputs, respectively) via current mirrors; such current mirrors are present in FIG. 4 and FIG. 5;

by connecting voltage inputs and outputs with level shifters, as will be described below.

While the circuit of FIG. 4 has been known as "Gilbert transconductance multiplier" (B. Gilbert, "A precise four-quadrant multiplier with subnanosecond response,"IEEE Journal of Solid-State Circuits, vol. 3, pp. 365–373, 1968, referred to as [4]) long before its use as a "soft-exclusive-OR" gate, the circuit of FIG. 5 and FIG. 6 has not previously been known as an adder.

Addition and Multiplication:

Both the adder function of the circuit of FIG. 5 and FIG. 6 as well as the (known) multiplier function of the circuit of FIG. 4 can be derived by rewriting equations (6) and (5), respectively, in terms of the log-quotient (3). From (5), it follows (after some calculations) that $$\tan h(r_z/2) = \tan h(r_x/2) \cdot \tan h(r_y/2), \quad (7)$$

which (up to a factor 2) for sufficiently small $r_x$ and $r_y$, is a good approximation of the multiplication $r_z \approx r_x \cdot r_y$. For the sake of completeness, it is also mentioned here that the circuit of FIG. 4 can be used also in another sense as a multiplier: the quantities $q_x = 2 \cdot p_x(0)/p_x(1) - 1$ (and accordingly $q_y$ and $q_z$), are related by $q_z = q_x \cdot q_y$ [4].

From (6), it follows immediately that $$r_z = r_x + r_y. \quad (8)$$

But every real number r can be expressed as in (3) as $r = \ln(p(0)/p(1))$ with $p(0) = e^r/(1+e^r)$ and $p(1) = 1/(1+e^r)$. The corresponding probability distribution (defined on the alphabet {0,1} will be referred to in the following as the probability representation of r.

The circuit of FIG. 5 or FIG. 6 is thus a general adder. The operands $r_x$ and $r_y$ as well as the result $r_z$ are represented either as voltage differences (4) or as probability distributions $p_x$, $p_y$, and $p_z$.

Exchanging $p(0)$ and $p(1)$ in (3) corresponds to a sign change of r. Such a sign change is thus obtained simply by exchanging the two wires that carry the currents representing $p(0)$ and $p(1)$, respectively. Therefore, multiplication of r by +/−1 is achieved by means of correspondingly controlled switches 3 of FIG. 7: if S2 is closed and S1 is open, the sign is changed; if S1 is closed and S2 is open, the sign is not changed. In other words, multiplication is a conditional exchange of the currents representing $p(0)$ and $p(1)$.

Figure 7:
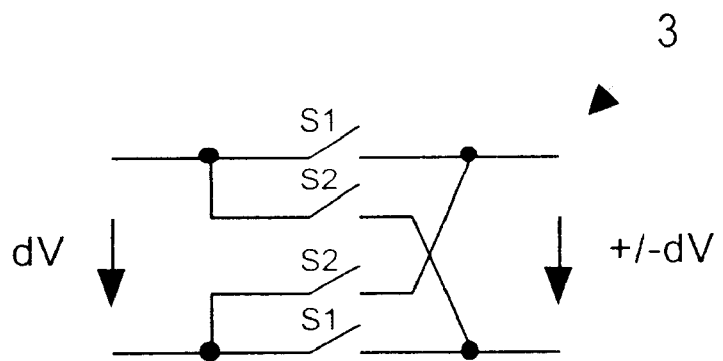
Figure 8:
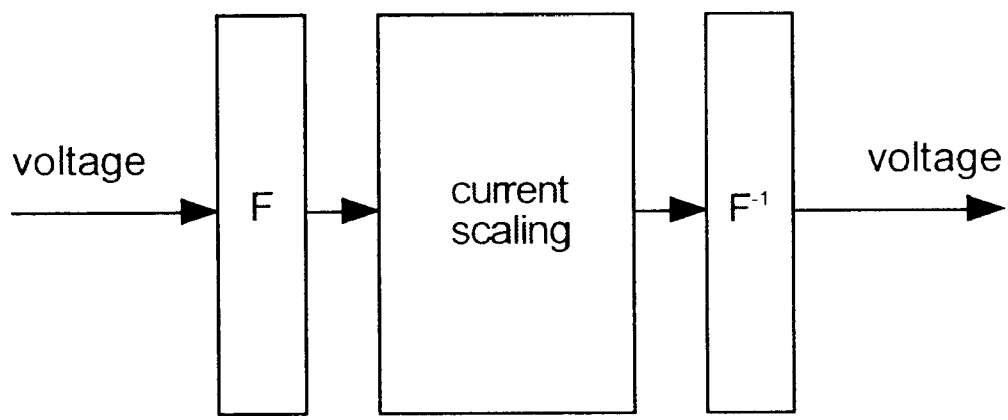

If none of the factors is binary (+/−1), but one of them takes on values in some finite, predefined set (e.g., {±1, ±3, ±5} or {1, 1.414, 1.731}), the multiplication can, instead by a Gilbert multiplier, be carried out by the method shown in FIG. 8. The task of computing a sum of products is then reduced to that of adding scaled input values, where each input value may require a separate scaling factor. One possible realization of the method of FIG. 8 consists of a combination of V/I converter, current scaling, and I/V converter. The current scaling can be implemented, e.g., by a finite number of switched current sources (as in a D/A converter). Alternatively, the voltage scaling can be carried out by a controllable voltage amplifier, directly or indirectly via switched capacities. A sign change can for example be implemented by cascading with the circuit of FIG. 7.

Figure 9:
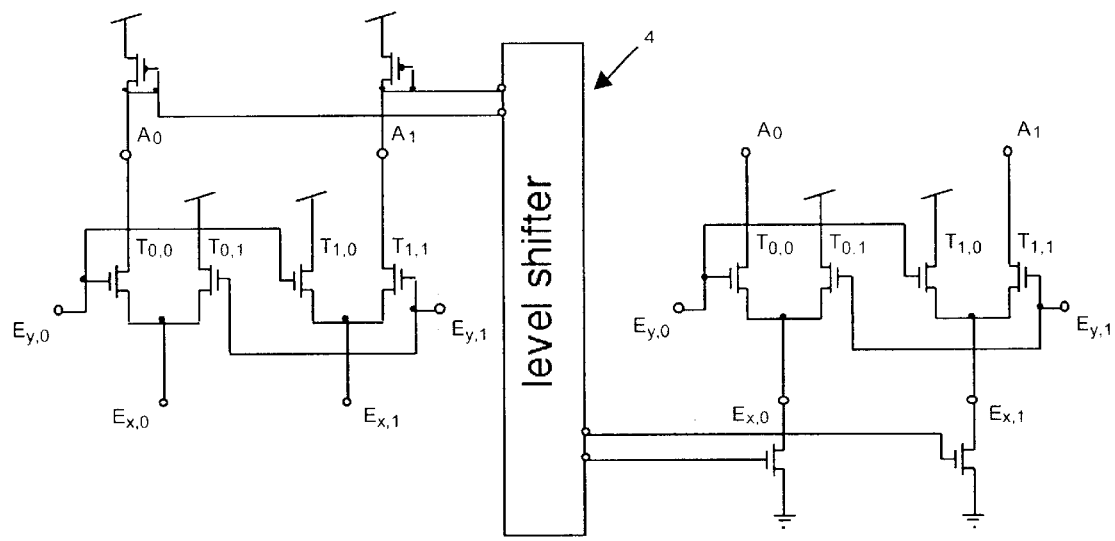

As shown in [1][2], circuit modules as in FIG. 4–6 can be cascaded, "piled up", and/or combined with scaling circuits [5][2]. The cascading can be carried out either by currents, as suggested by the current mirrors in FIGS. 4 and 5, or by voltages. The latter is illustrated in FIG. 9, where the output voltages of the diode-connected transistors are passed to the inputs of the subsequent stage via a level shifter 4. Such a level shifter may be implemented for example by a source follower circuit. Further circuit variations are obtained by using "upside-down" modules, in which the n-channel transistors (or npn-transistors) are replaced by p-channel transistors (or pnp-transistors). Some of the transistors may also be realized as "super transistors" such as, e.g., Darlington transistors or cascoded transistors. Bipolar transistors may be enhanced by a base current compensation.

The function of the circuit of FIG. 5 or 6 may also be approximated by transistors with non-exponential—in particular, quadratic—characteristic. Also, some transistors may operate partly outside of the saturation region or outside of the forward polarized region.

Since the usual addition circuits for voltages rely mostly on the addition of currents or, more generally, on the conservation of charge, they require a linear transformation of the voltages into currents. In contrast, the addition circuit of FIG. 5 or FIG. 6 has the advantage, that it can be freely connected both with itself and with the other circuits of [1], in particular, with the Gilbert multiplier 2. Due to the differential representation of the data as pair of currents of voltages, the circuit is fairly robust.

Application Examples

Figure 10:
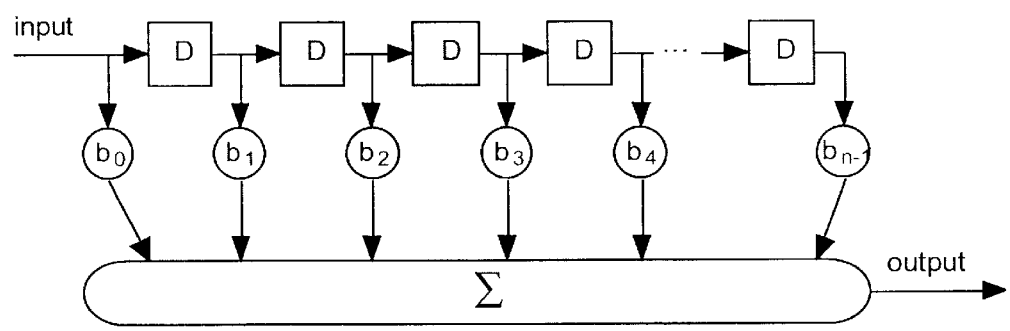

A widely used type of computation is the calculation of correlations $\Sigma_{i=0 \ldots k} u_i \cdot b_i$ or convolutions $\Sigma_{i=0 \ldots k} u_i \cdot b_{k-i}$. Such computations can be carried out by networks consisting of adders according to FIG. 5 or FIG. 6 and Gilbert multipliers (FIG. 4). This applies, in particular, to FIR filters (FIG. 10) with a finite impulse response, the output of which can be written as a convolution of delayed input samples with the coefficients of the impulse response. Similarly, the described technique can also be used to implement IIR filters with an infinite recursive impulse response. In the case where either the data $u_i$ or the coefficients $b_i$ in such a correlation or convolution take on the values +1 and −1 only, the realization requires only adders and switches, where the switches are used to change the sign by interchanging the two voltages or currents in a pair, as shown in FIG. 7. This important special case occurs in a number of applications, including the following:

In "spread spectrum" systems (e.g., code-division multiple access, CDMA), the desired spreading of the bandwidth is often achieved by a binary spreading sequence. For each data symbol $x_i$ to be transmitted, a sequence $y_{i,k} = x_i \cdot c_{i,k}, k = 0 \ldots N-1$, is sent, where the elements $c_{i,k}$ of the spreading sequence are either +1 or −1. In some usual types of receivers, the incoming sequence $Y_{i,k}$ is correlated with the binary spreading sequence, which is referred to as "despreading", in order to obtain an estimate $x_i' = \text{const} \cdot \Sigma_{k=0 \ldots N-1} c_{i,k} \cdot y_{i,k}'$ of the transmitted data symbol.

A well known method of measuring the propagation delay of signals (e.g., in radar and ultra-sonic measurements) consists in sending a binary (+/−1) sequence and analyzing the received reflections generated from one or several objects. By correlating the received signal with the transmitted sequence, the propagation delay of the signal corresponding to the individual reflections can be determined. The propagation delays correspond to the local maxima of the absolute value of the correlation function. In many applications, the propagation is used to determine further quantities such as, e.g., the distance or the velocity of some object or the depth of some layer.

Figure 11:
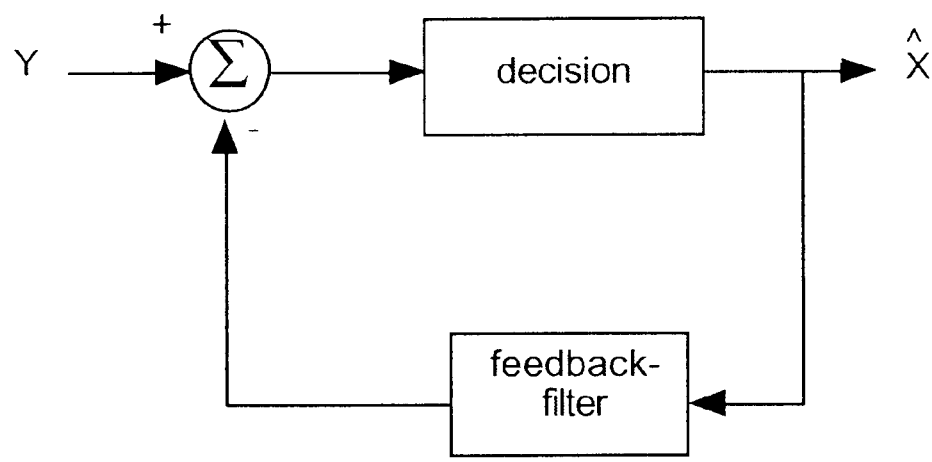

A popular technique in data communications receivers is to feed the decision about a transmitted data symbol back into the ongoing processing of other symbols in order to reduce interference problems and thus to enhance the quality (e.g. the error rate) of the decision of subsequent data; examples include "decision-feedback equalizers" (see FIG. 11) and "interference cancellation" techniques in multiple-access systems. The feedback path often contains a suitable linear filter, which convolves its input with the filter coefficients. If the transmitted data symbols (and thus the decisions on these symbols) are binary (+/−1), the described special case arises.

In many applications, for some specified system model, the output data corresponding to many or all input signals is computed. Often, the system model is, or contains, the convolution, of the input with certain coefficients, such as, e.g., the system model corresponding to the transmission of data over linear channels with memory. The mentioned special case arises if the inputs to the system model are binary symbols. This type of computation arises, e.g., as part of the metric computation in Viterbi decoders and related methods such as reduced-state sequence estimators (see M. V. Eyuboglu, S. U. H. Qureshi, "Reduced State Sequence Estimation with Set Partitioning and Decision Feedback", IEEE Transactions of Communications, Vol. 36, No. 1, pp. 13–20, January 1988 and the references contained therein).

Apart from correlations and multiplications with +/−1-valued data or coefficients (and versions thereof that include some scale factor or offset), multipliers can also be dispensed with (i.e., replaced by switches and scaling circuits as described above) in correlations or convolutions where the coefficients (or data symbols) are taken from a finite set of known values.

Figure 12:
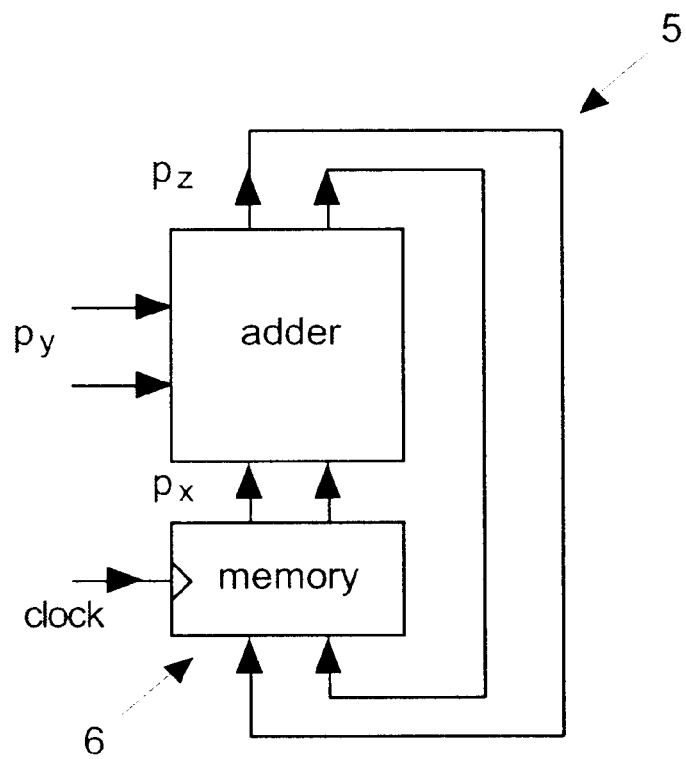
Figure 13:
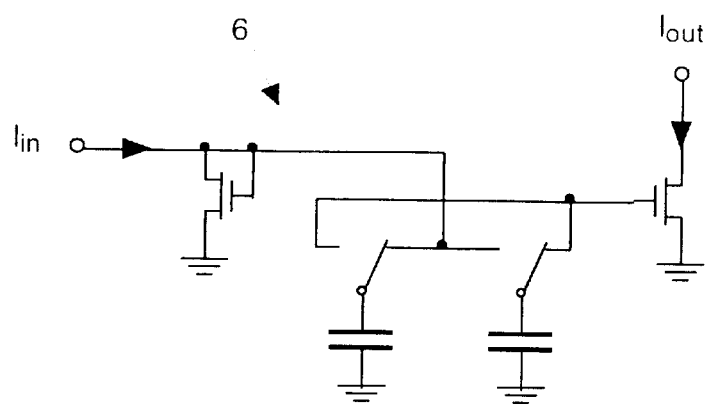

The additions can be carried out either by k parallel adders or—e.g., if the product terms arise sequentially —by a single adder together with an accumulator 5, as is schematically indicated in FIG. 12. The accumulator stores the previous adder output and feeds it back into one of the adder inputs. The required storage element can be realized, e.g., directly by voltage storage elements (capacitors) or by "current storage" elements 6 as outlined in FIG. 13; many implementations of such current storage elements are known from switched-current technology, see C. Toumazou, J. B. Hughes, and N. C. Battersby, "Switched-Currents, An Analogue Technique for Digital Technology", IEE Circuits and Systems Series 5. Peter Peregrinus Ltd., 1993, and the references therein.

Another application is the computation of the expected value of some discrete random variable X, which can formally be expressed as a correlation:

$E[f(X)] = \Sigma_{i=0\ldots k} f(x_i) \cdot p(x_i)$. If X takes values in some finite set only, the values $f(x_i)$ are also in some finite set; since the values $f(x_i)$ are known a priori, the expected value can be pre-computed by the methods described above. Such expected values are used, e.g., in decision-feedback equalizers with "soft feedback", where, instead of a "hard decision", a graded value is fed back containing some information of the reliability of the decision; one version of such a graded value is the conditional expected value $E[X|Y=y]$ of the data symbol X (to be decided upon) given the received data $Y=y$, which may be a scalar or a vector.

Figure 14:
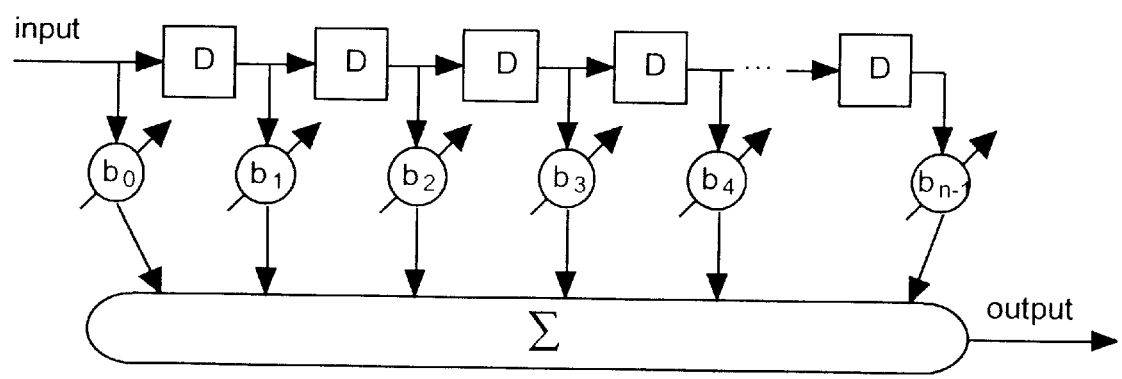
Figure 15:
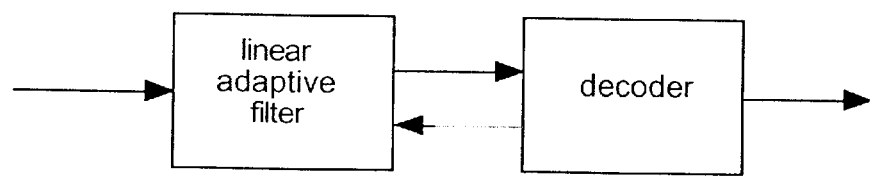

The mentioned applications arise in particular in receivers for digital data transmission (e.g., for wire-less or wire-bound communications). Such receivers often contain a preprocessing unit with linear adaptive filters (FIG. 14) and a nonlinear decoder, see FIG. 15. (Nonlinear decoders are, e.g., decision-feedback equalizers and Viterbi decoders.) If the latter uses a probability network as in [1] and/or one of the techniques described above, it can be attractive to realize such linear filters by means of the techniques described above. In contrast to FIR filters with fixed coefficients $b_i$ (FIG. 10), in adaptive filters, the coefficients $b_i$ are adjustable continuously or in discrete steps (FIG. 14). Such adjustment is usually effected by an algorithm which tries to minimize some sort of cost function. In principle, adaptive IIR filter can also be implemented in such a way.

Due to the nonlinearity (7), computation networks with adders as in FIG. 5 or FIG. 6 and Gilbert multipliers (FIG. 4) are also suitable for use in "neural" networks, which can also be described as sums and products together with nonlinearities (S. Haykin, "Neural Networks", IEEE Press, 1994, New York).

While there are shown and described presently preferred embodiments of the invention, it is to be distinctly understood that the invention is not limited thereto but may be otherwise variously embodied and practised within the scope of the following claims.

What is claimed is:

1. A method for mathematically processing at least to values $r_x$ and $r_y$ in a combination circuit, which combination circuit comprises two current inputs $E_{x,0}$ and $E_{x,1}$ for the value $r_x$, two voltage inputs $E_{y,0}$ and $E_{y,1}$ for the value $r_y$, two current outputs $A_0$ and $A_1$ for a result $r_z$, and four transistors $T_{0,0}$, $T_{0,1}$, $T_{1,0}$, $T_{1,1}$, wherein the sources or emitters of the transistors $T_{0,0}$ and $T_{0,1}$ are connected to the current input $E_{x,0}$, the sources or emitters of the transistors $T_{1,0}$ and $T_{1,1}$ to the current input $E_{x,1}$, the gates or bases of the transistors $T_{0,0}$ and $T_{1,0}$ to the voltage input $E_{y,0}$, the gates or bases of the transistors $T_{0,1}$ and $T_{1,1}$ to the voltage input $E_{y,1}$, the drain or collector of the transistor $T_{0,0}$ to the current output $A_0$, the drain or collector of the transistor $T_{1,1}$ with the current output $A_1$, and the drains or collectors of the transistors $T_{0,1}$ and $T_{1,0}$ to a reference potential providing a saturation or forward polarization, said method comprising the steps of feeding two input currents $I_x p_x(0)$ and $I_x p_x(1)$ through the current inputs $E_{x,0}$ and $E_{x,1}$, wherein a quotient of said input currents is equal to $e^{r_x}$, applying an input voltage between said voltage inputs $E_{y,0}$ and $E_{y,1}$ proportional to $r_y$, and generating, with said-combination circuit, two output currents at the current outputs $A_0$ and $A_1$, wherein a quotient of said output currents is equal to $e^{r_x+r_y}$, and deriving, from said output currents, a sum of the values $r_x$ and $r_y$.

2. The method of claim 1, comprising the step of determining said sum of the values $r_x$ and $r_y$ by means of calculating a logarithm of said quotient of the output currents.

3. The method of claim 2, comprising the step of feeding each the output currents $A_0$ and $A_1$ through a diode connected transistor Tz0a and Tz1a, respectively.

4. The method of claim 3, wherein said transistors Tz0a and Tz1a each are part of two current mirrors.

5. The method of claim 1 comprising the step of applying the value $r_x$ as a voltage difference over the gate or base of two transistors Tx0a, Tx1a for generating the input currents.

6. The method of claim 5, wherein the transistors Tx0a, Tx1a each are part of two current mirrors.

7. The method of claim 1, comprising the step of generating the input voltage over the voltage inputs $E_{y,0}$ and $E_{y,1}$ by feeding each of two input currents, $I_y p_y(0)$ and $I_y p_y(1)$ through diode connected transistors Ty0a, Ty1a.

8. The method of claim 7, comprising the step of scaling said input currents $I_y p_y(0)$ and $I_y p_y(1)$ by generating them by means of two transistors TV1, TVn, the sources or emitters of which are connected to a common current source.

9. The method of claim 1, comprising the step of scaling said input currents $I_x p_x(0)$ and $I_x p_x(1)$ and/or said output currents by generating them by means of two transistors TV1, TVn, the sources or emitters of which are connected to a common current source.

10. The method of claim 1 comprising the step of connecting at least some of said current inputs $E_{x,0}$ and $E_{x,1}$ said voltage inputs $E_{y,0}$ and $E_{y,1}$ and said current outputs $A_0$ and $A_1$ to a further combination circuit or a Gilbert multiplier.

11. The method of claim 10, wherein said step of connecting comprises the application of at least one of a current mirror and a level shifter.

12. The method of claim 1 comprising the step of exchanging corresponding currents or voltages for inverting a sign of one of said values.

13. The method of claim 1 comprising the step of storing said input currents $I_x p_x(0)$ and $I_x p_x(1)$ and/or said output currents in a current storage.

14. The method of claim 13, wherein said current storage comprises at least one storage capacitor, a current voltage converter and a voltage current converter.

15. The method of claim 1 comprising the step of connecting the current outputs of the combination circuit via a current storage to said current inputs.

16. The method of claim 1 comprising the step of connecting the current outputs of the combination circuit via a voltage storage to said voltage inputs.

17. The method of claim 1, wherein the voltage applied between the voltage inputs $E_{y,0}$ and $E_{y,1}$ is equal to $(U_T/\kappa) \cdot r_y$, wherein $U_T$ is a thermal voltage of the transistors and $\kappa$ is a dimension-less constant.

18. The method of claim 1 wherein said sum is used for calculating a correlation and/or convolution of a plurality of values, wherein a plurality of input values are multiplied in multipliers with coefficients to generate sub-products, and wherein said sub-products are fed to at least one combination circuit.

19. The method of claim 18, wherein said values and/or coefficients are discrete.

20. The method of claim 19, wherein said values and/or coefficients are binary and used to conditionally exchange currents or voltages.

21. The method of claim 1 comprising the step of using the combination circuit in one of a linear filter, an adaptive filter, a decision feedback filter, a Viterbi equalizer and a metric calculation.

22. The method of claim 1 comprising the step of using the combination circuit in one of a correlation or a sequence despreading.

23. The method of claim 1 comprising the step of using the combination circuit for calculating a sum $\Sigma_{i=0 \ldots k}$ of a function of the type $\Sigma_{i=0 \ldots k} f(x_i) p(x_i)$, wherein said sum is calculated in at least one combination circuit.

* * * * *